United States Patent [19]
Dmitroca

[11] Patent Number: 6,072,343
[45] Date of Patent: Jun. 6, 2000

[54] CLOCK AND TRIGGER DESIGN FOR LARGE INSTRUMENT

[75] Inventor: Robert Walter Dmitroca, N. Vancouver, Canada

[73] Assignee: Hewlett-Packard Company, Palo Alto, Calif.

[21] Appl. No.: 09/084,070

[22] Filed: May 22, 1998

[51] Int. Cl.$^7$ ........................................ H03L 7/00
[52] U.S. Cl. .................... 327/144; 327/141; 327/146
[58] Field of Search ................................. 327/141, 144, 327/147, 150, 162, 163, 146, 156

[56] References Cited

U.S. PATENT DOCUMENTS

| 5,293,374 | 3/1994 | Eidson | 364/579 |
| 5,815,018 | 9/1998 | Soborski | 327/295 |
| 5,939,910 | 8/1999 | Rouger | 327/160 |

*Primary Examiner*—Kenneth B. Wells

[57] ABSTRACT

The inventive mechanism is included with each module in a chain of modules. The inventive mechanism includes a clock mechanism which is edge synchronous among all of the clock mechanisms in the other modules, meaning that each clock has the same frequency and zero phase delay with respect to the clocks of the other modules. The clock mechanism of the first module of the chain is the master, the subsequent clocks are slaves. The inventive mechanism includes a trigger mechanism which allows each module of the chain to initiate a trigger event. The trigger mechanism is tied to the clock mechanism, so that the trigger signal is sent out on the next rising edge of the clock. Since each module is tied to the same clock frequency and has zero delay, when one module sends out a trigger, the remaining modules will detect the trigger on the next clock cycle, and the trigger event will begin simultaneously in all modules.

20 Claims, 2 Drawing Sheets

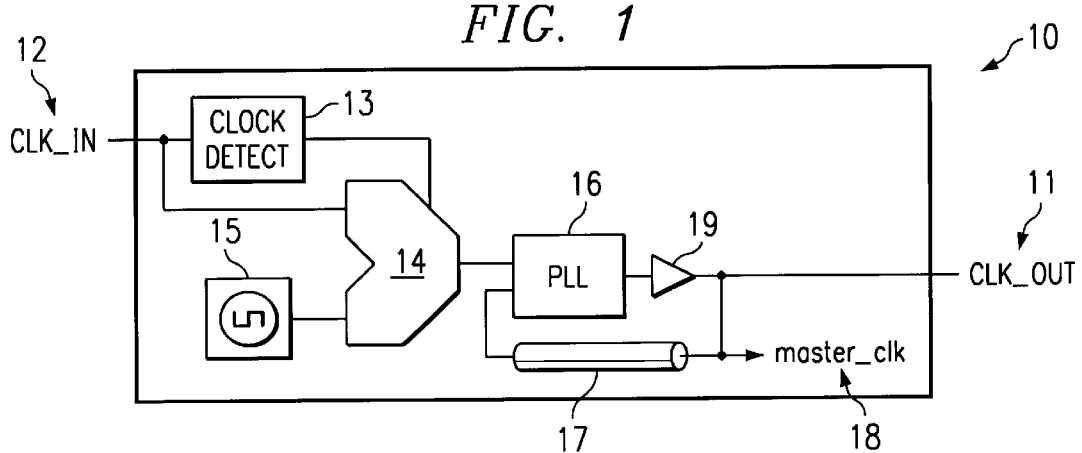
FIG. 1
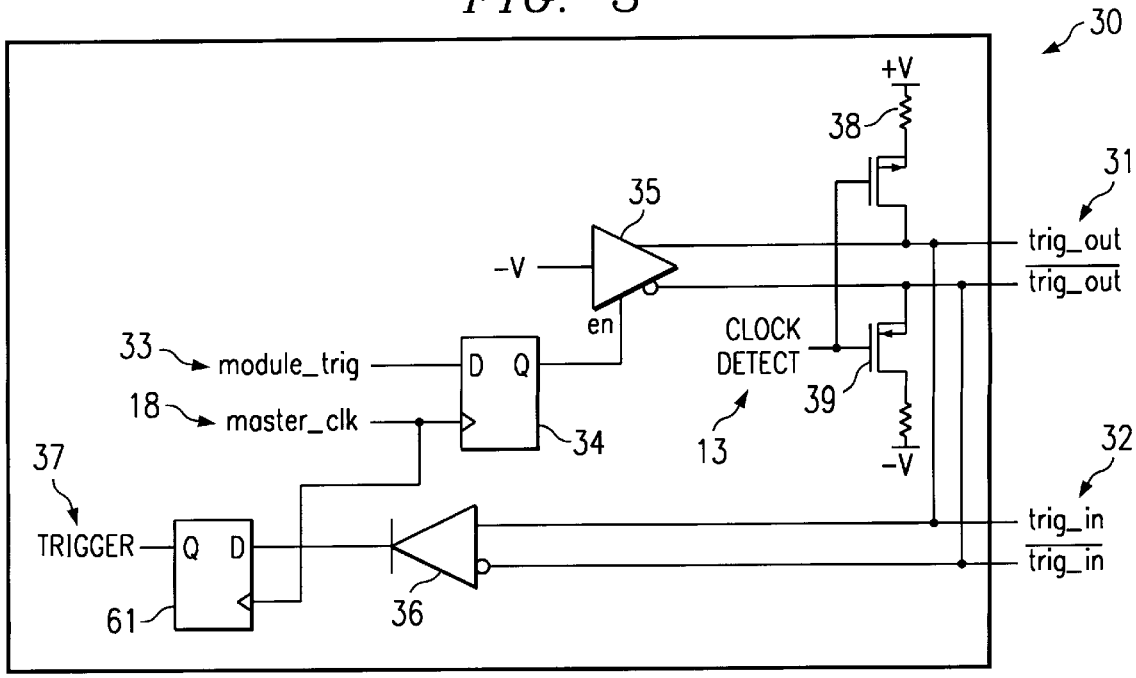
FIG. 2
FIG. 3

2

CLOCK AND TRIGGER DESIGN FOR LARGE INSTRUMENT

BACKGROUND OF THE INVENTION

Large instruments can typically comprise several modules. These modules may be located physically apart from each other. Consequently, design of the instrument can be troublesome, particularly when all of the modules are required to have a common trigger which may be driven by any particular module and received by all of the modules. The common trigger is required so that each of the modules begin measurements at the same time. If they do not start at the same time, then errors will be introduced into the measured results.

For example, as shown in FIG. 5, large instrument 50 includes several modules 51, 52, and 53. Each module has an open collector driver 54. The trigger outputs 55 are connected together by an external connection 56, typically a coaxial cable. One module would have a pull-up resistor (not shown) to set the trigger line to the inactive or non-triggered state. Each of the modules or instruments would be able to monitor the trigger line. Note that the modules may be separated by distances of a few inches to several yards. As the number of modules increases, the shared trigger line 56 becomes longer and longer. Thus, the transmission line discontinuities grow. As each module attempts to drive the trigger line the waveform will not be seen as a clean edge transition by all other modules.

The actual waveform 61 of the trigger line of FIG. 5 is shown in FIG. 6. The desired or ideal waveform 62 is shown for comparison. Note that the fall time of trigger line waveform 61 is very slow, as compared to the ideal waveform 62. This is due to the large distributed capacitance inherent in the trigger line from the large number of modules and the length of the line to interconnect them, for example 30 modules interconnected with a total of 30 feet of cable. Thus, any module listening to the trigger line would have difficulties determining where the edge transition occurs. This difficulty is especially prevalent if digital switching noise is also present. Also note that transmission line or trigger line impedance mismatches can cause reflections. This is depicted in the oscillations or over-shoot and undershoot in the trigger line waveform 61. Undershoot can cause receiver circuits to falsely sense a trigger event.

Furthermore, the large number of modules, and the long distances between the first module and the last module would introduce a long propagation delay into the signal. Thus, as the signal travels down the trigger line, skew is introduced between one module and the next. This skew accumulates as the signal travels to each subsequent module and could reach 100 nanoseconds or even higher. Thus, all of the modules would not start their measurements at the same time.

A prior art solution to this problem is to form a star topology, instead of a chain, wherein a first module would generate the trigger stimulus. The stimulus would then go to a MUX which would run to each of the remaining modules via equal lengths of wire. Thus, the total delay received by each module would be equal, and each of the modules would start at the same time. However, this arrangement does not allow for each module to trigger an event, as only the center or first module is connected to the MUX. Each module must be wired to the remaining modules of the instrument to permit any particular module to initiate a trigger event. This requires a great deal of interconnect, which quickly becomes untenable as the number of modules increases. For example, a 10 module system requires 90 wires, while a 20 module system requires 380 wires. Note that each of the wires must be of the same length. This is known as a fully meshed topology.

Therefore, there is a need in the prior art for a clock and trigger mechanism which will allow for each of the modules to initiate a trigger event, while still having all of the modules start their measurements at the same time. In other words, the system would have little skew, which would allow for accurate measurements.

SUMMARY OF THE INVENTION

These and other objects, features and technical advantages are achieved by a system and method which includes a clock mechanism which is edge synchronous among all modules, meaning that each clock has the same frequency and zero phase delay with respect to the clocks of the other modules. Each module has a trigger mechanism such that each module can initiate a trigger event. Since each module is tied to the same clock frequency and has zero delay, when one module sends out a trigger, the remaining modules will detect the trigger on the next clock cycle. Note that the period of the clock is longer than the time it takes for the trigger signal to settle down after transmission line instabilities. Thus, false trigger events will not occur.

Therefore, it is a technical advantage of the invention to provide a clock signal which has the same clock frequency and zero phase delay with respect to the other clocks of the system.

It is another technical advantage of the invention to allow each module to initiate a trigger event.

It is a further technical advantage of the invention to have a series of modules connected in a chain.

It is a further technical advantage of the invention to a have the head module of the series generate the clock to which the other modules of the chain are tied.

It is a further technical advantage of the invention to drive an event that is synchronous to a highly stabilized clock, and each module recognize the event on the next clock edge, and thereby simultaneously start the event.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 depicts the inventive clock mechanism;

FIG. 2 depicts an alternative MUX for use in the mechanism of FIG. 1;

FIG. 3 depicts the inventive trigger mechanism;

DESCRIPTION OF THE PREFERRED EMBODIMENTS

Figure 4:
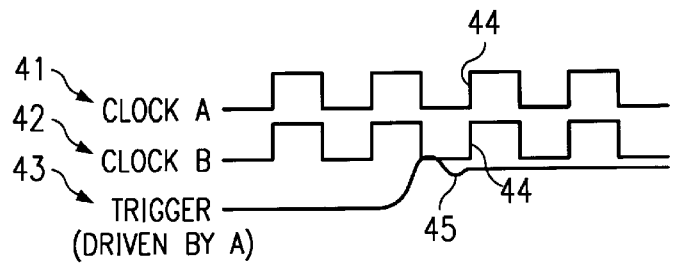
FIG. 4 depicts the waveforms of the clock mechanism of FIG. 1 and the trigger mechanism of FIG. 3.
Figure 5:
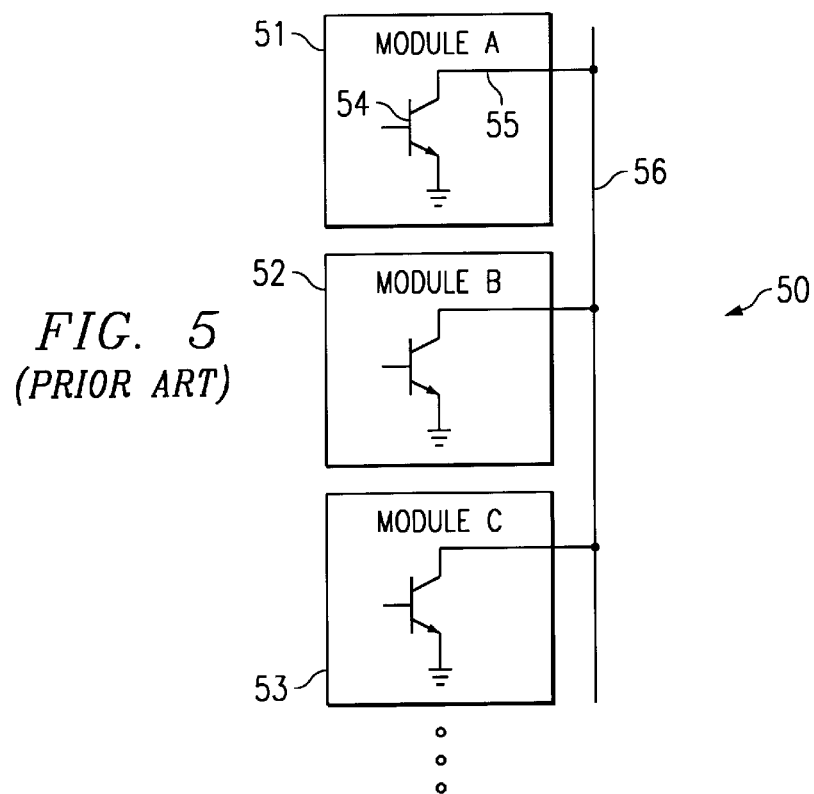
FIG. 5 depicts a prior art arrangement of several modules connected via a common trigger line.
Figure 6:
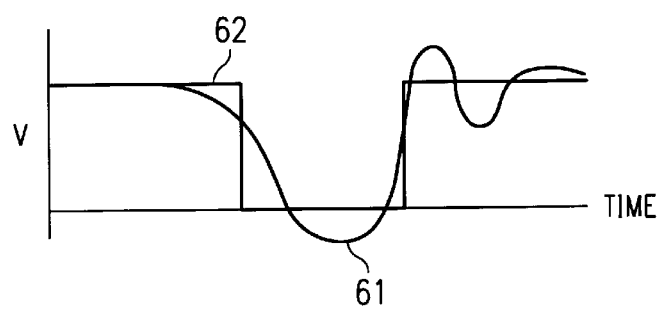
FIG. 6 depicts the waveform of the trigger line of FIG. 5, along with an ideal waveform for comparison.

FIG. 1 depicts the inventive clock mechanism 10. Each module would have a clock mechanism 10. The clock out signal CLK_OUT 11 is connected to the clock in signal CLK_IN 12 of the subsequent module in the chain. This connection is replicated throughout the chain. Note that the first module in the chain would not have a CLK_IN 12 connection, and the last module in the chain would not have a CLK_OUT 11 connection.

Clock mechanism 10 determines whether it is the first module in the chain. Clock detect circuitry 13 ascertains if there is a clock in signal CLK_IN 12 being delivered to the module. If there is no signal, then the module is the first module or master, and clock detect 13 switches MUX 14 from CLK_IN 12 to internal oscillator 15. Note that a break in the connection chain could cause a module that was in the middle of the chain to become the master for the remainder of the chain. The signal from internal oscillator 15 is used as the clock signal for the subsequent modules of the chain, as it is driven to the clock output CLK_OUT 11 onto subsequent modules (if any), via PLL 16, which acts like a zero delay buffer.

Note that multiplexer or MUX 14 in FIG. 1 could be replaced with a zero delay MUX 21 as shown in FIG. 2. This MUX is a three state buffer which is controlled by clock detect 13. If there is a signal on CLK_IN 12, then the three state buffer is disabled and the CLK_IN 12 passes into the instrument. If there is no signal on CLK_IN 12, then the three state buffer is enabled and the signal from the oscillator 15 passes to point 22. Note that there would not be a conflict at point 22, as one of the signals, CLK_IN or oscillator 15 is enabled at any one time.

If clock detect 13 determines that the module is not the first in the chain, or is a slave, then MUX 14 connects CLK_IN 12 to PLL 16. Thus, if the module is not the master module, then the input clock signal CLK_IN 12 is replicated on the output signal CLK_OUT 11. From a system perspective, it appears that the module has a zero delay buffer. This appearance is achieved by PLL 16. PLL 16 is configured for frequency replication and zero degree phase delay. Thus, PLL 16 appears to be a zero delay buffer. The use of PLL 16 provides the phase and frequency stability for clock mechanism 10. PLL 16 phase locks the clock mechanism of the module to the previous clock mechanism, meaning that the input path and feedback path have the same phase. Thus, as more modules are connected together, each clock becomes synchronous with the previous clock. Therefore, each clock mechanism in the system is synchronous with the other clocks of the system, and has the same rising edges, and no skew. Note that in design, the inventive clock mechanism will theoretically have zero delay. However, in actuality it will have some phase delay, on the order of 100s of picoseconds. Thus, the terms substantially zero phase delay and substantially no phase delay include a phase delay on the order of 100s of picoseconds.

FIG. 1 also includes a piece of coaxial cable 17 in the feedback loop of PLL 16. Coaxial cable 17 would be the same length as the coaxial cable which is used to connect the next module, i.e connect CLK_OUT 11 to CLK_IN 12. This would insure that there is the same path length and impedance between the feedback loop and the connection wire. However, this feature is not necessary if subnanosecond precision is not required. Note that coaxial cable is by way of example only, as cable 17 would be of the same type of connecting material as used to connect the subsequent module.

Buffer 19 is used to boost the output of the PLL allowing it to drive co-ax cable 17 and the cable that connects to CLK_OUT of the module to the subsequent CLK_IN 12 of the next module. The signal master_clk 18 is sent to the trigger mechanism 30. A heartbeat circuit (not shown) is used to reset all of the modules' counting mechanisms. The heartbeat occurs every 100 milliseconds, and is created by gapping one clock cycle out of CLK_OUT 11. The subsequent module can recognize this missing cycle as a heartbeat. The PLL, however, will continue to create a clock from the CLK_IN 12, since a PLL can be made to be insensitive to the occasional missing or gapped clock.

FIG. 3 depicts the inventive trigger mechanism 30. Each module would have a trigger mechanism 30. The trigger out signals trig_out and BAR(trig_out) 31 are connected to the trigger in signals trig_in and BAR(trig_in) 32 of the subsequent module in the chain. This connection is replicated throughout the chain. Thus, all modules may drive and monitor the trigger line. Note that the first module in the chain would not have the trigger in connections, and the last module in the chain would not have the trigger out connections. All modules receive the trigger signals, since trig_out and trig_in are connected together. Note that the trig_out signal would travel in both directions, i.e. to previous modules on the chain, as well as subsequent modules on the chain.

The module_trig signal 33 is sent or driven by the module to the trigger mechanism 30 to initiate a trigger event. The triggering module will see the trigger on the next clock edge, which is at the same time as the other modules. This signal 33 is sent to D flip-flop 34 which synchronizes the trigger signal 33 and the clock signal master_clk 18 from the clock mechanism of FIG. 1 which is located in the same module as the trigger mechanism 30. Thus, the trigger signal will not be sent out of D flip-flop 34 until the next rising edge.

The output of D flip-flop is fed into differential driver 35. Differential driver 35 is constructed so it can only drive in one direction. Note that differential driver 35 can only assert the trigger line negative This is required since multiple modules could assert the trigger and would cause driver conflicts. The difference in the voltage determines the logic level. For example, if the BAR output of driver 35 is of lower voltage than the other output, receiver 36 would interpret this to mean a logic 1. If the voltage of the BAR output was higher than the other line, this would be interpreted as a logic 0.

The output of differential driver 35 is sent out of the module as the trigger out signals 31 trig_out and BAR (trig_out). The trigger out signals 31 are connected to the subsequent module as the trigger in signals 32. The trigger line is differential to increase the upper limit on the number of modules which can be connected together. In a large instrument, undesirable signals from external equipment can corrupt long wire connectors, such as the trigger line. Also as a signal travels down a long wire, some of its energy is lost. In absolute voltage logic, this loss would eventually cause a receiver to malfunction. Differential signaling is more tolerant of common mode corruption from external equipment and is more tolerant of signal losses. The logic level is determined by the relative difference of voltages between two lines. The loss of signal in each line does not affect their relative position to each other. The trigger inputs 32 are used by each module to determine the state of the trigger line. The inputs are sent to trigger receiver 36 which compares the two signals to determine if a trigger event has occurred. If receiver 36 has determined that an event has occurred, then it will send out the trigger signal TRIGGER 37 to the device under test or system under test. A second flip-flop 61, which receives the output of the trigger receiver 36, latches the activation of TRIGGER with the clock signal. Thus the TRIGGER will be sent out on the next rising edge. The trigger signal sent to a module on the trigger in lines 32 is immediately sent out of that module on the trigger out lines 31, as the in and out lines are connected together.

FIG. 3 also depicts line keeper resistors 38 and MOSFETs 39. Note that a signal from clock detect 13 controls the gates of the MOSFETs. If the module is the first module or master, then the MOSFETs conduct and cause the line to be driven to the high or inactive state. Note that this will cause a conflict, but, the resistors are chosen so they cannot supply as much current as the driver, and therefore the driver is capable of driving the line active. In other words, the driver wins the conflict in a non-destructive manner.

Note that some skew or latency is inherent in this system, from the propagation of the trigger signal. However, as long as the skew is less than the period of the clock, then the inventive system will operate properly. If each module receives the trigger signal within the one clock period skew, then on the next rising edge, each module will see the trigger signal. Note that this occurs at the same time, and thus, each module will begin the trigger event at the same time, since the clocks have no phase delay.

FIG. 4 depicts the two clock output signals 41, 42 of the clock mechanism 10, one in module A and the other one in module B, and a trigger signal 43 from module A. Note that the frequency and phase of the clock signals 41 and 42 is substantially identical. Thus, when module A initiates a trigger event, both module A and module B will detect the trigger on the next rising edge 44.

The following is an example as to how the two modules A and B could use the clock and trigger mechanism for latency measurement purposes. Module A will stimulate a system under test (SUT) and module B will measure the resulting output from the SUT. Thus, module A will drive a trigger that will be seen by module B. Note that a device under test (DUT) could be used instead of a SUT. However, this example is by way of illustration only.

The modules are separated by a relatively large distance of 30 feet. Note that the trigger line will show transmission line instabilities 45 as it is driven. However, this does not pose any measurement difficulty since triggers are now sampled synchronously. Both module B, and module A will see the trigger on the next clock cycle. Thus, triggers are limited to be on clock cycle boundaries. For example if the clock frequency has been set to 10 MHZ the finest trigger resolution would be 100 ns.

Each module would have a timer (not shown) with ns precision capable of counting time from when the trigger occurs to the next clock edge. Therefore, assume the clocks 41, 42 occur on 100 ns boundaries. Module A decides a trigger event occurred at 73 ns. Module A drives the trigger line 43 at 100 ns, which is the first opportunity. Modules A and B will see the trigger at 200 ns. Module B then starts looking for an output from the SUT. Suppose this occurs at 788 ns. A processor (not shown) in module B calculates the delay time of 588 ns (788−200), adds the offset from module A, 27 ns, (100−73), and adds the trigger delay 100 ns to determine the total delay of 715 ns from the initial determination that an event should be triggered. Note that this measurement technique only works for delays which exceed two clock cycles or 200 ns.

Although the present invention and its advantages have been described in detail, it should be understood that various changes, substitutions and alterations can be made herein without departing from the spirit and scope of the invention as defined by the appended claims.

What is claimed is:

1. An apparatus for triggering an event in a module, wherein the module is one of a plurality of modules of an instrument, and wherein the plurality of modules are connected to form a chain, the apparatus comprising:

a clock circuit that provides a clock signal which has substantially zero phase delay as compared to clock signals of clock circuits in selected modules of the plurality of modules and substantially similar clock frequency as compared to the clock circuits in the selected modules of the plurality of modules; and a trigger circuit that receives the clock signal and provides a trigger signal which is used to trigger the event in the module and is distributed to the selected modules of the plurality of modules, wherein the trigger signal is latched to the clock signal such that the trigger signal is distributed on the first available rising edge of the clock signal.

2. The apparatus of claim 1, wherein the clock circuit comprises:

a clock signal-in line for receiving a previous clock signal from a previous module of the chain;

an oscillator for generating a clock signal;

a clock detect circuit which determines if the module is the first module in the chain; and means for selecting one of the received clock signal and the clock signal generated by said oscillator to be an internal clock signal based on the determination of the clock detect circuit;

wherein the means for selecting selects the clock signal generated by said oscillator if the module is the first module of the chain, else the means for selecting selects the received clock signal.

3. The apparatus of claim 2, wherein:

the means for selecting is a multiplexer that is controlled by the clock detect circuit.

4. The apparatus of claim 2, wherein:

the means for selecting is a three state buffer that is controlled by the clock detect circuit.

5. The apparatus of claim 2, wherein the clock circuit further comprises:

a phase locked loop device which receives the internal clock signal from the means for selecting and outputs the internal clock signal;

wherein the phase locked loop device acts as a zero delay buffer.

6. The apparatus of claim 5, wherein:

a feedback loop of the PLL includes a first connector which has a same length and material composition as a second connector which is used to connect a module of the chain to a subsequent module of the chain.

7. The apparatus of claim 1, wherein the trigger circuit comprises:

a flip-flop which receives the clock signal and a trigger initiation signal which is sent by the module, and outputs an internal trigger signal which is synchronized to the clock signal such that the internal trigger signal is outputted on the rising edge of the subsequent clock signal after receiving the trigger initiation signal;

a trigger driver which receives the internal trigger signal and outputs the trigger signal; and a trigger mechanism which triggers the event in the module upon receipt of the trigger signal;

wherein the trigger initiation signal is sent when the module requires the trigger event to occur in the module.

8. The apparatus of claim 7, wherein:

the trigger driver is a differential driver; and the trigger signal comprises a pair of signals with one signal of the pair of signals being the inverse of the other signal of the pair of signals.

9. The apparatus of claim 1, wherein:

a latency of distribution of the trigger signal in the chain is less than one clock cycle of the clock signal, such that each module of the chain receives the trigger signal prior to the rising edge of the subsequent clock cycle of the clock signal after distribution of the trigger signal.

10. A method for triggering an event in a module, wherein the module is one of a plurality of modules of an instrument, the method comprising the steps of:

providing a clock signal which has substantially zero phase delay as compared to clock signals in the remaining modules of the plurality of modules and substantially similar clock frequency as compared to the clock signals in the remaining modules of the plurality of modules, wherein the plurality of modules are connected to form a chain;

providing a trigger signal which is used to trigger the event in the module and is distributed to the remaining modules of the plurality of modules; and latching the trigger signal to the clock signal such that the trigger signal is distributed on the first available rising edge of the clock signal.

11. The method of claim 10, wherein the step of providing a clock signal comprises the steps of:

receiving a previous clock signal from a previous module of the chain;

generating a clock signal;

determining if the module is the first module in the chain; and selecting one of the received clock signal and the generated clock signal to be an internal clock signal based on the step of determining;

wherein the step of selecting selects the generated clock signal if the module is the first module of the chain, else the step of selecting selects the received clock signal.

12. The method of claim 11, wherein:

the step of selecting is performed by a multiplexer that is controlled by the determination of the step of determining.

13. The method of claim 11, wherein:

the step of selecting is performed by a three state buffer that is controlled by the determination of the step of determining.

14. The method of claim 11, wherein the step of providing a clock signal further comprises the steps of:

phase locking the internal clock signal via a phase locked loop device (PLL);

wherein the phase locked loop device acts as a zero delay buffer.

15. The method of claim 14, wherein:

a feedback loop of the PLL includes a first connector which has a same length and material composition as a second connector which is used to connect a module of the chain to a subsequent module of the chain.

16. The method of claim 10, wherein the step of latching comprises the steps of:

receiving a trigger initiation signal which is sent by the module when the module requires the trigger event to occur; and synchronizing the trigger initiation signal with the clock signal such that an internal trigger signal is outputted on the rising edge of the subsequent clock signal after receiving the trigger initiation signal.

17. The method of claim 16, wherein the step of providing a trigger signal comprises the steps of:

driving the trigger signal from the internal trigger signal; and triggering the event in the module upon receipt of the trigger signal.

18. The method of claim 10, wherein:

a latency of distribution of the trigger signal in the chain is less than one clock cycle of the clock signal, such that each module of the chain receives the trigger signal prior to the rising edge of the subsequent clock cycle of the clock signal after distribution of the trigger signal.

19. A system for triggering an event in a plurality of modules of an instrument, wherein the modules are connected to form a chain, the system comprising:

a plurality of clock circuits, wherein each clock circuit is associated with a particular one of the plurality of modules, and wherein each clock circuit provides a clock signal which has substantially zero phase delay as compared to clock signals of the remaining clock circuits of the plurality of clock circuits and substantially similar clock frequency as compared to the remaining clock circuits of the plurality of clock circuits; and a plurality of trigger circuits, wherein each trigger circuit is associated with a particular one of the plurality of modules, wherein each trigger circuit receives the clock signal from the clock circuit of the same module with which the trigger circuit is associated, wherein each trigger circuit provides a trigger signal which is used to trigger the event in the module and is distributed to the remaining modules of the plurality of modules, and wherein the trigger signal is latched to the clock signal such that the trigger signal is distributed on the first available rising edge of the clock signal.

20. The system of claim 19, wherein:

each clock circuit includes a clock signal-in line for receiving a previous clock signal from a previous module of the chain;

an oscillator for generating a clock signal;

a clock detect circuit which determines if the module is the first module in the chain;

means for selecting one of the received clock signal and the clock signal generated by said oscillator to be an internal clock signal based on the determination of the clock detect circuit, wherein the means for selecting selects the clock signal generated by said oscillator if the module is the first module of the chain, else the means for selecting selects the received clock signal; and a phase locked loop device which receives the internal clock signal from the means for selecting and outputs the internal clock signal, wherein the phase locked loop device acts as a zero delay buffer; and each trigger circuit includes a flip-flop which receives the clock signal and a trigger initiation signal which is sent by the module, and outputs an internal trigger signal which is synchronized to the clock signal such that the internal trigger signal is outputted on the rising edge of the subsequent clock signal after receiving the trigger initiation signal, wherein the trigger initiation signal is sent when the module requires the trigger event to occur in the module;

a trigger driver which receives the internal trigger signal and outputs the trigger signal; and a trigger mechanism which triggers the event in the module upon receipt of the trigger signal.

* * * * *